United States Patent
Gutzki et al.

(10) Patent No.: US 7,405,614 B2
(45) Date of Patent: Jul. 29, 2008

(54) CIRCUIT ARRANGEMENT HAVING AN AMPLIFIER ARRANGEMENT AND AN OFFSET COMPENSATION ARRANGEMENT

(75) Inventors: Heiko Gutzki, Grafing (DE); Marcus Nuebling, Olching-Esting (DE)

(73) Assignee: Infineon Technologies AG, Munich (DE)

( * ) Notice: Subject to any disclaimer, the term of this patent is extended or adjusted under 35 U.S.C. 154(b) by 90 days.

(21) Appl. No.: 11/417,495

(22) Filed: May 4, 2006

(65) Prior Publication Data

US 2007/0013439 A1     Jan. 18, 2007

(30) Foreign Application Priority Data

May 4, 2005     (DE)     ............ 10 2005 020 803

(51) Int. Cl.
   *H03F 1/02*     (2006.01)
(52) U.S. Cl. .................................... 330/9; 330/136
(58) Field of Classification Search .................. 330/9, 330/129, 136; 327/124, 307
   See application file for complete search history.

(56) References Cited

U.S. PATENT DOCUMENTS

| | | | | |
|---|---|---|---|---|
| 5,047,727 A | * | 9/1991 | Theus | ............................ 330/9 |
| 6,653,895 B1 | | 11/2003 | Douts et al. | |
| 7,265,615 B2 | * | 9/2007 | Alexander et al. | ............ 330/69 |
| 7,271,649 B2 | * | 9/2007 | Chiu et al. | ..................... 330/9 |

OTHER PUBLICATIONS

Finvers, Ivars G. and Haslett, J.W., "A High Temperature Precision Amplifier." *IEEE Journal of Solid-State Circuits*, vol. 30, Feb. 1995, pp. 120-128. (9 Pages).

* cited by examiner

*Primary Examiner*—Henry K Choe
(74) *Attorney, Agent, or Firm*—Maginot, Moore & Beck

(57) ABSTRACT

A circuit arrangement is disclosed herein comprising an amplifier circuit having inputs configured to receive an input signal, and an output configured to provide an output signal. The circuit arrangement further comprises a first operational amplifier. The first operational amplifier includes inputs coupled to the inputs of the amplifier circuit, an output coupled to the output of the amplifier circuit, and a first compensation input. The compensation input is configured to feed an offset compensation signal to the first operational amplifier. The circuit arrangement further comprises a first compensation circuit configured to provide the offset compensation signal. The first compensation circuit is coupled to the inputs of the first operational amplifier. The circuit arrangement further comprises a deactivation circuit which is designed to temporarily deactivate the first compensation circuit.

17 Claims, 7 Drawing Sheets

CIRCUIT ARRANGEMENT HAVING AN AMPLIFIER ARRANGEMENT AND AN OFFSET COMPENSATION ARRANGEMENT

FIELD

The present invention relates to a circuit arrangement having an amplifier arrangement, which has an operational amplifier, and having an offset compensation arrangement connected to the amplifier arrangement and serving for the offset compensation of the operational amplifier.

BACKGROUND

Such a circuit arrangement is described for example in Finvers et al.: "A High Temperature Precision Amplifier", IEEE Journal of Solid-State Circuits, Vol. 30, No. 2, February 1995, pages 120-128. Operational amplifiers in amplifier circuits are usually connected up in such a way that a voltage between the inputs of the operational amplifier is ideally zero. If the operational amplifier is beset with an offset, then an offset voltage not equal to zero is established between the inputs of said operational amplifier, which leads to a corruption of the measurement result. In such circuits, the offset compensation arrangement serves to detect such an offset voltage present between the inputs of the operational amplifier and to generate an offset compensation signal. Said compensation signal is fed to an offset compensation input of the operational amplifier in order to regulate the offset voltage between the inputs of the operational amplifier to zero.

This offset compensation by detecting the input voltage of the operational amplifier and generating the compensation signal depending on the input voltage may lead to problems when a frequently changing input signal is fed to the operational amplifier. This is because, in the event of a level change of the input signal, the input voltage difference of the operational amplifier is initially not zero until the operational amplifier has again attained a settled state. This input voltage difference not equal to zero is registered as an offset by the offset compensation arrangement and incorrectly leads to a change or adaptation of the compensation signal.

Offset compensation arrangements usually have an integrating behavior, which has the effect that the offset compensation signal increases with the number of level changes of the input signal or with the number of settling operations of the operational amplifier. The consequence of this is that the operational amplifier is "overcompensated", so that precisely during the settled state of the operational amplifier there is an offset present which increases as the number of level changes of the input signal increases or as the number of settling operations of the operational amplifier increases.

It would therefore be advantageous to provide a circuit arrangement having an amplifier arrangement—which has an operational amplifier—and having an offset compensation arrangement which does not have these disadvantages.

SUMMARY

A circuit arrangement is disclosed comprising an amplifier arrangement having inputs for feeding in an input signal, an output for providing an output signal and having a first operational amplifier. The operational amplifier has inputs coupled to the inputs of the amplifier arrangement, an output coupled to the output of the amplifier arrangement, and a first compensation input for feeding in an offset compensation signal. The circuit arrangement additionally has a first compensation arrangement, which is coupled to the inputs of the first operational amplifier and which provides the offset compensation signal. Moreover, a deactivation circuit is present, which is designed to temporarily deactivate the first compensation arrangement.

In the case of the circuit arrangement according to at least some embodiments of the invention, the temporary deactivation of the compensation arrangement by the deactivation circuit prevents a situation in which, during those time durations during which the first operational amplifier settles after a level change of the input signal, a voltage difference between the inputs of the first operational amplifier is detected as an offset by the compensation arrangement. Such detection of the input voltage difference as an offset during the settling operations of the first operational amplifier would lead to an erroneous generation of the compensation signal in the manner explained above.

The deactivation circuit may suitably be designed to deactivate the first compensation arrangement depending on the input signal. In one embodiment, the deactivation circuit deactivates the first compensation arrangement in each case for a predetermined time duration after a level change of the input signal.

The above described features and advantages, as well as others, will become more readily apparent to those of ordinary skill in the art by reference to the following detailed description and accompanying drawings.

BRIEF DESCRIPTION OF THE DRAWINGS

In the figures, unless specified otherwise, identical reference symbols designate identical circuit components and signals with the same meaning.

DESCRIPTION

Figure 1:
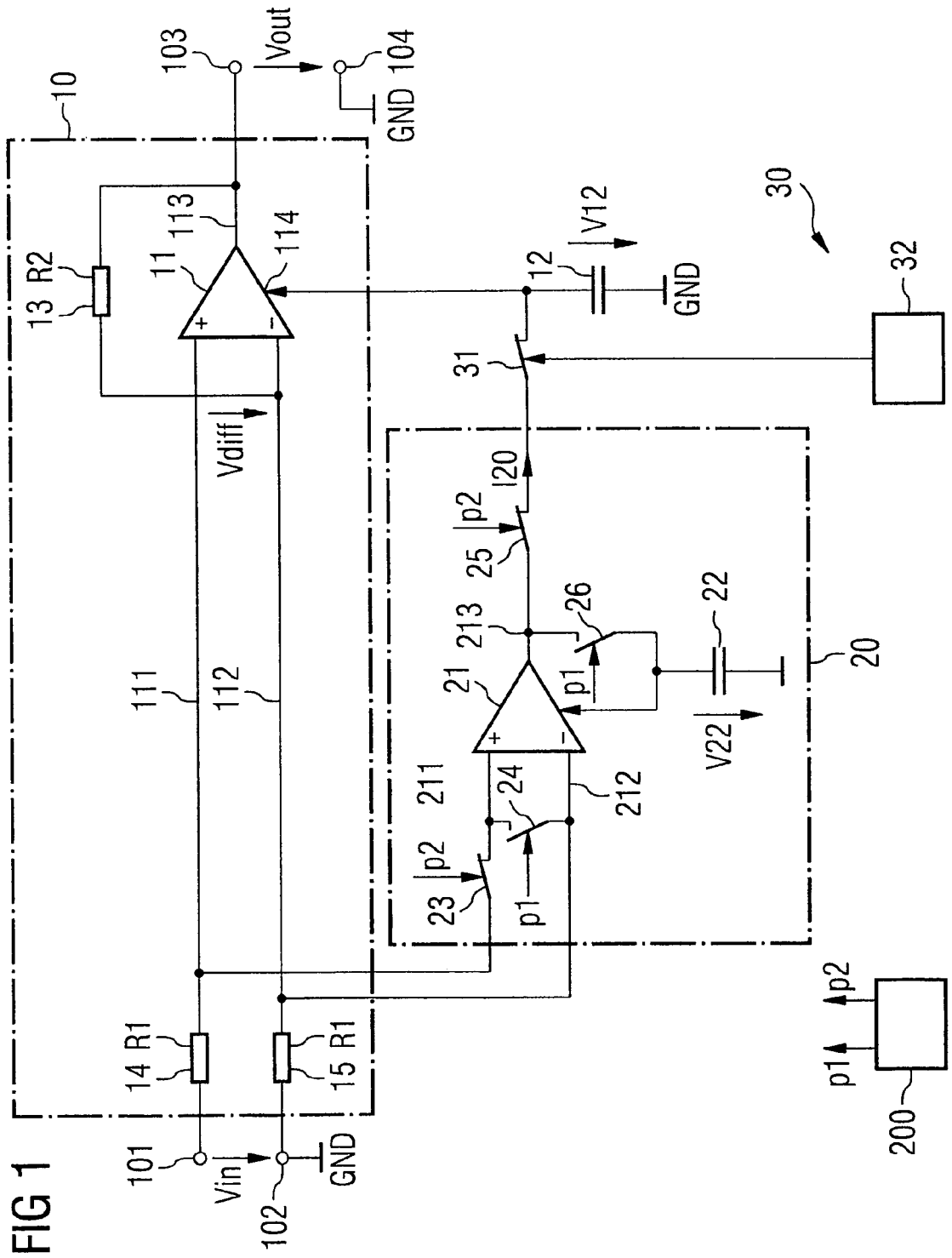
FIG. 1 shows a first exemplary embodiment of a circuit arrangement according to one embodiment of the invention having an amplifier circuit, an offset compensation circuit and a deactivation circuit for the offset compensation circuit.

An exemplary circuit arrangement according to at least one embodiment of the invention as illustrated in FIG. 1 has an amplifier arrangement 10 having inputs 101, 102 for feeding in an input signal Vin and having outputs 103, 104 for providing an output signal Vout. In the example, the input signal Vin and the output signal Vout are voltages which are referred in each case to a reference-ground potential GND. The input 102 and the output 104 are at said reference-ground potential GND. The amplifier arrangement 10 has a first operational amplifier 11 having inputs 111, 112 and an output 113. In the example, the noninverting input 111 of the operational amplifier 11 is connected to the input 101 of the amplifier arrangement 10 via a resistor 14, and the inverting input 112 of the operational amplifier 11 is connected to the input 102 of the amplifier arrangement 10 via a further input resistor 15. The output 113 of the first operational amplifier 11 is connected to the output 103 of the amplifier arrangement 10. The output 113 of the operational amplifier 11 is furthermore feedback-connected to the inverting input 112 of said operational amplifier via a feedback resistor 13. After application of an input voltage Vin, a differential voltage Vdiff=0 is established between the inputs 111, 112 of the operational amplifier 11 after a settling operation has proceeded. In the case of the circuitry illustrated, the following holds true for the output voltage Vout of the operational amplifier 11:

$$V\text{out}=R2/R1 \tag{1}$$

In this case, R1 designates the resistances of the input resistors 14, 15 and R2 designates the resistance of the feedback resistor 13.

For example due to temperature influences or else due to production-dictated variations in the parameters of the components present in the operational amplifier 11 (not illustrated in greater detail), an offset, that is to say an input difference Vdiff not equal to zero, may be present in the settled state of the operational amplifier 11. In order to compensate for such an input offset, the first operational amplifier 11 has a compensation input 114 for feeding in a compensation signal. In the example, said compensation signal is a voltage V12 present across a first capacitive storage element, which in the example is connected between the compensation input 114 and reference-ground potential GND.

Said compensation signal V12 is generated by a compensation circuit 20 connected to the inputs 111, 112 of the first operational amplifier 11 in order to detect the input voltage difference Vdiff thereof and to generate the compensation signal V12 depending on said input voltage difference Vdiff in conjunction with the capacitive storage element 12. The compensation circuit 20 has a second operational amplifier 21, which is designed as a transconductance amplifier in the example and which thus generates an output current I20 dependent on the input voltage difference Vdiff in order to charge the capacitive storage element 12. In principle, the compensation arrangement 20 generates an output current I20 as long as the input difference Vdiff of the first operational amplifier 11 is not equal to zero, in order thereby to change the compensation signal V12 until it has been adjusted to a value at which the offset or the input voltage difference Vdiff is zero.

Since the transconductance amplifier 21 of the compensation arrangement 20 may also be beset with an offset the compensation arrangement 20 has a further compensation arrangement serving for the offset compensation of the transconductance amplifier 21. In accordance with the first operational amplifier 11 of the amplifier arrangement 10, the transconductance amplifier 21 has a compensation input 214 for feeding in an offset compensation signal V22. A second capacitive storage element 22 is connected between said compensation input 214 and reference-ground potential GND, the offset compensation signal V22 of said transconductance amplifier 21 being present across said second capacitive storage element. Said second capacitive storage element 22 is part of the compensation arrangement of said transconductance amplifier 21.

Said compensation arrangement additionally has a first switch 23 for interrupting the connection between the first input 211 of the transconductance amplifier 21 and the first input 111 of the operational amplifier 11, a second switch 24 for short-circuiting the inputs 211, 212 of the transconductance amplifier 21, a third switch 25 for connecting the output 213 of the transconductance amplifier 21 to the first capacitive storage element 12, and also a fourth switch 26 for connecting the output 213 of the transconductance amplifier 21 to the second capacitive storage element 22. Said switches 23, 24, 25, 26 of the compensation arrangement of the transconductance amplifier 21 are driven by switching signals p1, p2 generated by a control circuit 200, which is merely illustrated schematically. Said control signals p1, p2 are complementary to one another and chosen such that the first and fourth switches 23, 25 are always opened and closed together and that the second and fourth switches 24, 26 are always opened and closed together. In this case, the first and third switches 23, 25, on the one hand, and the second and fourth switches, 24, 26, on the other hand, are always driven complementarily to one another.

The control circuit 200 controls the offset compensation of the transconductance amplifier 21 by the second compensation arrangement. During a compensation operation in which the compensation signal V22 is generated, the first and third switches 23, 25 are opened in order to decouple the transconductance amplifier 21 from the first operational amplifier 11. The second and fourth switches 24, 26 are closed in order to short-circuit the inputs 211, 212 of the transconductance amplifier 21 and in order to connect the output 213 of the transconductance amplifier 21 to the second capacitive storage element 22. If the transconductance amplifier 21 has an offset, then there is available at its output 213 despite short-circuited inputs 211, 212, an output current which charges the capacitor 22 via the fourth switch 26 in order to increase the second compensation signal V22. Said compensation signal V22 serves for offset compensation internally in the transconductance amplifier 21.

The offset of the transconductance amplifier 21 is completely compensated for when the output current of said transconductance amplifier becomes zero and, as a result, the compensation signal V22 does not rise any further. After the conclusion of the compensation operation, the second and fourth switches 24, 26 are opened and the first and third switches 23, 25 of the compensation arrangement of the transconductance amplifier 21 are closed.

The compensation operation explained above for the transconductance amplifier 21 may suitably be repeated at regular time intervals, in which case, during the compensation operation, in the manner explained, the second and fourth switches 24, 26 are for example closed for a fixedly predetermined time duration and the other two switches 23, 25 are opened for this time duration. In a manner that is not illustrated in more specific detail, there is in this connection also the possibility of providing a discharge circuit for the capacitive storage element 22 which completely discharges the capacitive storage element 22 in each case before the beginning of a compensation operation, in order subsequently to generate a second compensation signal V22 again with the second and fourth switches 24, 26 closed. It should be pointed out in this connection that the compensation signal V22 is maintained after the opening of the fourth switch 26, so that only the first compensation signal V12 is changed during the compensation operation.

An operating state of the transconductance amplifier in which the second and fourth switches 24, 26 are closed is referred to below as "compensation operating state", while an operating state in which said switches 24, 26 are open and the other two switches 23, 25 are closed is referred to as "normal operating state".

The task of the first compensation arrangement 20 is, in conjunction with the first capacitive storage element 12 connected to the offset compensation input 114 of the operational amplifier 11, to generate an offset compensation signal V12 for the operational amplifier 11.

In order to generate the first offset compensation signal V12, the transconductance amplifier 21 is operated in the normal operating mode. The transconductance amplifier 21 then detects the voltage Vdiff present between the inputs 111, 112 of the operational amplifier 11 and generates an output current I20 at its output 213, said output current being dependent on said voltage difference Vdiff. In the ideal situation, if the operational amplifier 11 is not beset with an offset, this input voltage difference Vdiff is zero in the settled state of the operational amplifier 11. In this case, the output current I20 of the transconductance amplifier 21 is likewise zero provided that the transconductance amplifier 21 is not itself beset with an offset, which is assumed below.

If the first operational amplifier 11 is beset with an offset, then the input voltage difference Vdiff is not equal to zero and the transconductance amplifier 21 supplies an output current I20 not equal to zero, which charges the capacitive storage element 12 in order thereby to increase the offset compensation voltage V12. In this case, the compensation voltage V12 is increased until the input voltage Vdiff of the first operational amplifier is zero and the offset of the first operational amplifier 11 has thus been compensated for. The first compensation signal V12 is maintained if the transconductance amplifier 21 undergoes transition from the normal operating state to the compensation operating state and the third switch 25 is opened.

As already explained, the input voltage difference Vdiff of the operational amplifier 11 is normally zero. In particular during a settling phase after a change in the input signal Vin, however, said input voltage difference Vdiff may assume a value not equal to zero. Unless additional measures are taken, said input voltage difference Vdiff, during the settling phase, would be interpreted as an offset by the compensation arrangement 20, which would lead to an increase in the offset compensation signal V12 of the operational amplifier 11.

The compensation arrangement 20 with the capacitive storage element 12 has an integrating behavior, which equivalently means that those input voltage differences Vdiff which are not equal to zero would be integrated during the settling operations explained and would lead to a continuous increase in the offset compensation signal V12 unless additional measures are implemented.

Input voltage differences Vdiff not equal to zero can furthermore also be generated by the input voltage source that generates the input voltage Vin, as is explained below with reference to FIG. 2.

Figure 2:
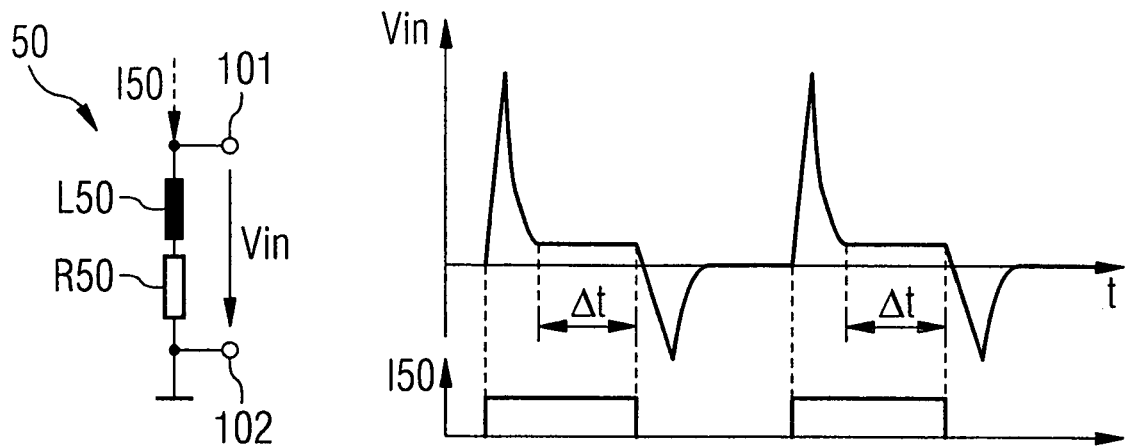
FIG. 2 shows, by way of example, temporal profiles for an input signal of the amplifier arrangement, which signal is a voltage present across a measuring resistor.

FIG. 2 shows, in the left-hand part, a device for generating an input voltage Vin of the amplifier arrangement 20. This arrangement 50 comprises a measuring resistor or shunt resistor, through which a measurement current I50 flows. It shall be assumed that said measurement current I50 is a pulsed current that is switched on and off. The amplifier arrangement 10 generates an output signal Vout dependent on said measurement current I50 by means of the measuring resistor 50. The measuring resistor 50 comprises a nonreactive resistance component R50 and a parasitic inductance component L50. As is illustrated in the right-hand part of FIG. 2, said parasitic inductance component leads to voltage spikes in the input voltage Vin both when the measurement current I50 is switched on and when the measurement current I50 is switched off. Said voltage spikes likewise lead to an input voltage difference Vdiff not equal to zero and would be integrated by the compensation arrangement 20 unless further measures are implemented.

In order to avoid a situation in which input voltage differences Vdiff not equal to zero which are caused by the parasitic effects explained or by settling operations of the operational amplifier 11 lead to a corruption of the offset compensation signal V12, the circuit arrangement has, according to at least one embodiment of the invention, a deactivation circuit 30, which is designed to temporarily deactivate the first compensation circuit 20. In the example, said deactivation circuit 30 has a switch 31, which is connected downstream of an output of the compensation arrangement 20 and which prevents, in the open state, a changing of the offset compensation signal V12 by the compensation arrangement 20. A drive circuit 32 is present for driving said switch 31, which drive circuit is designed to open the switch 31 temporarily, such as during settling operations of the operational amplifier 11 or during predetermined time durations after changes in the input signal Vin. Input voltage differences Vdiff not equal to zero which occur during these time durations thus cannot affect the offset compensation signal V12 of the operational amplifier 11.

In the example, the compensation arrangement 20 is deactivated when it does not supply an output signal which can change the compensation signal V21 generated up to that point.

Figure 3:
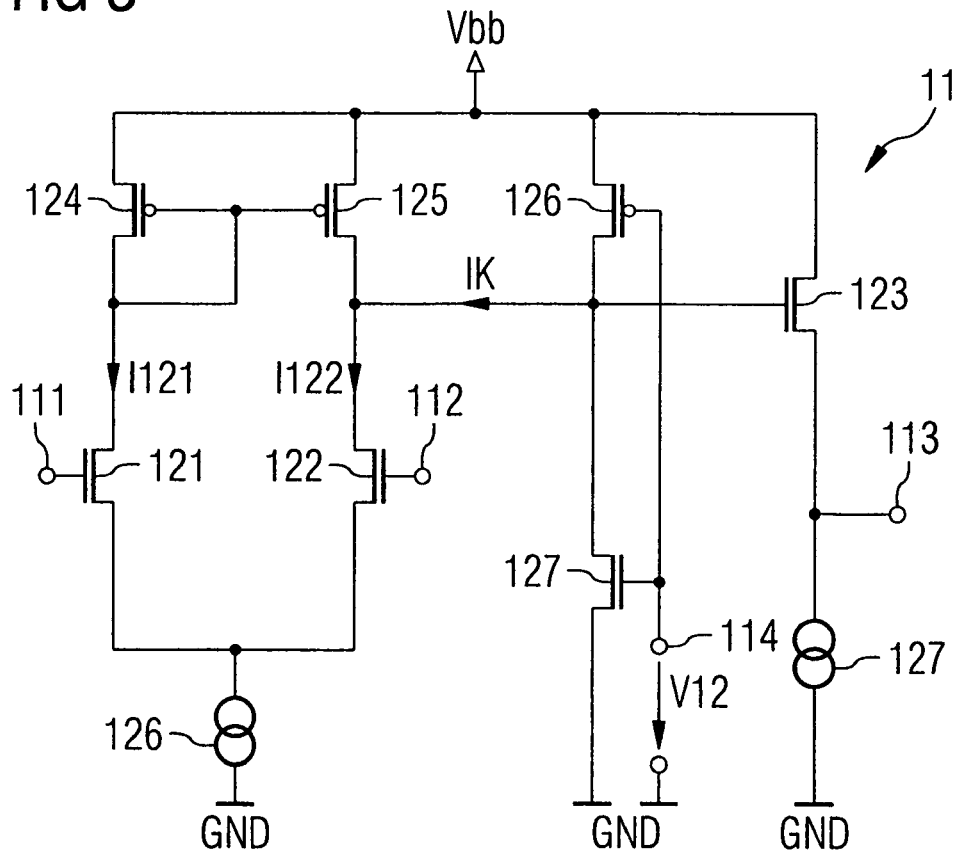
FIG. 3 shows an exemplary circuitry realization of an operational amplifier having one offset compensation input.

In order to afford a better understanding of the function of the offset compensation signal V12, FIG. 3 shows a simple exemplary circuitry realization of an operational amplifier having an offset compensation input 114. This operational amplifier has a differential amplifier stage having first and second input transistors 121, 122, the control terminals of which form the inputs 111, 112 of the operational amplifier. In the example, said transistors 121, 122 are formed as n-channel MOSFETs whose source terminals are connected to one another and are connected to reference-ground potential GND via a current source 126 serving as a load. The drain terminals of said MOSFETs 121, 122 are connected to a supply potential Vbb via a current mirror having two further transistors 124, 125. Said current mirror 124, 125 comprises two p-channel transistors, a first current mirror transistor 124 of which is connected up as a diode. The current mirror 124, 125 maps a current flowing through the first input transistor 121 onto a current flowing through the second current mirror transistor 125. An output stage of this operational amplifier is formed by a series circuit comprising a further n-channel MOSFET 123 and a further current source 127. In this case, the output 113 of the operational amplifier 11 is formed by a node common to the further transistor 123 and the current source 127. A control terminal of said further n-channel transistor 123 is connected to a node common to the second current mirror transistor 125 and the second input transistor 122.

The operational amplifier has a compensation stage having a first compensation transistor 126, which is formed as a p-channel transistor 126 in the example, and a second compensation transistor 127, which is formed as an n-channel transistor in the example. The two compensation transistors 126, 127 are jointly driven by the compensation signal V12 present at the compensation input 114. For this purpose, the gate terminals of these two transistors 126, 127 are connected to the compensation input 114. The task of the compensation transistors 126, 127 is to reduce or increase the current I122 through the input transistor 122 according to the compensation signal V12. For this purpose, a node common to the two compensation transistors 126, 127 is connected to a node common to the current mirror transistor 125 and the input transistor 122.

The functioning of the illustrated operational amplifier having the compensation stage is explained below:

This operational amplifier is not beset with an offset when the currents I121, I122 through the input transistors 121, 122 are of identical magnitude given identical input voltages at the inputs 111, 112. Identical input voltages are present when the voltage between the two inputs 111, 112 is zero.

The operational amplifier is beset with an offset if these two currents I121, I122 are not identical given identical input voltages. In the case of an input voltage difference equal to zero, an output voltage not equal to zero is available. If such an operational amplifier beset with an offset is connected up in the manner illustrated in FIG. 1 such that the output is feedback-connected to one of the inputs, then such an offset has an effect such that an input voltage difference not equal to zero is established. Such an offset is compensated for by the compensation stage 126, 127 in that, according to the compensation signal V12, the current through the second input transistor 122 is increased or decreased in order to adapt the current I122 through said input transistor 122 to the current I121 through the other input transistor 121.

If the compensation signal V12 in the case of this arrangement assumes a first value, at which the two compensation transistors 126, 127 are driven identically, then a current flowing from the compensation stage 126, 127 is equal to zero. The compensation current Ik is positive in order to increase the current through the input transistor 122 if the compensation signal V12 falls below the first value. In this case, the first compensation transistor 126 is driven to a greater extent than the second compensation transistor 127. The compensation current Ik is negative in order to reduce the current through the input transistor 122 if the compensation signal V12 rises above the first value. In this case, the second compensation transistor 127 is driven to a greater extent than the first compensation transistor 126.

Figure 4:
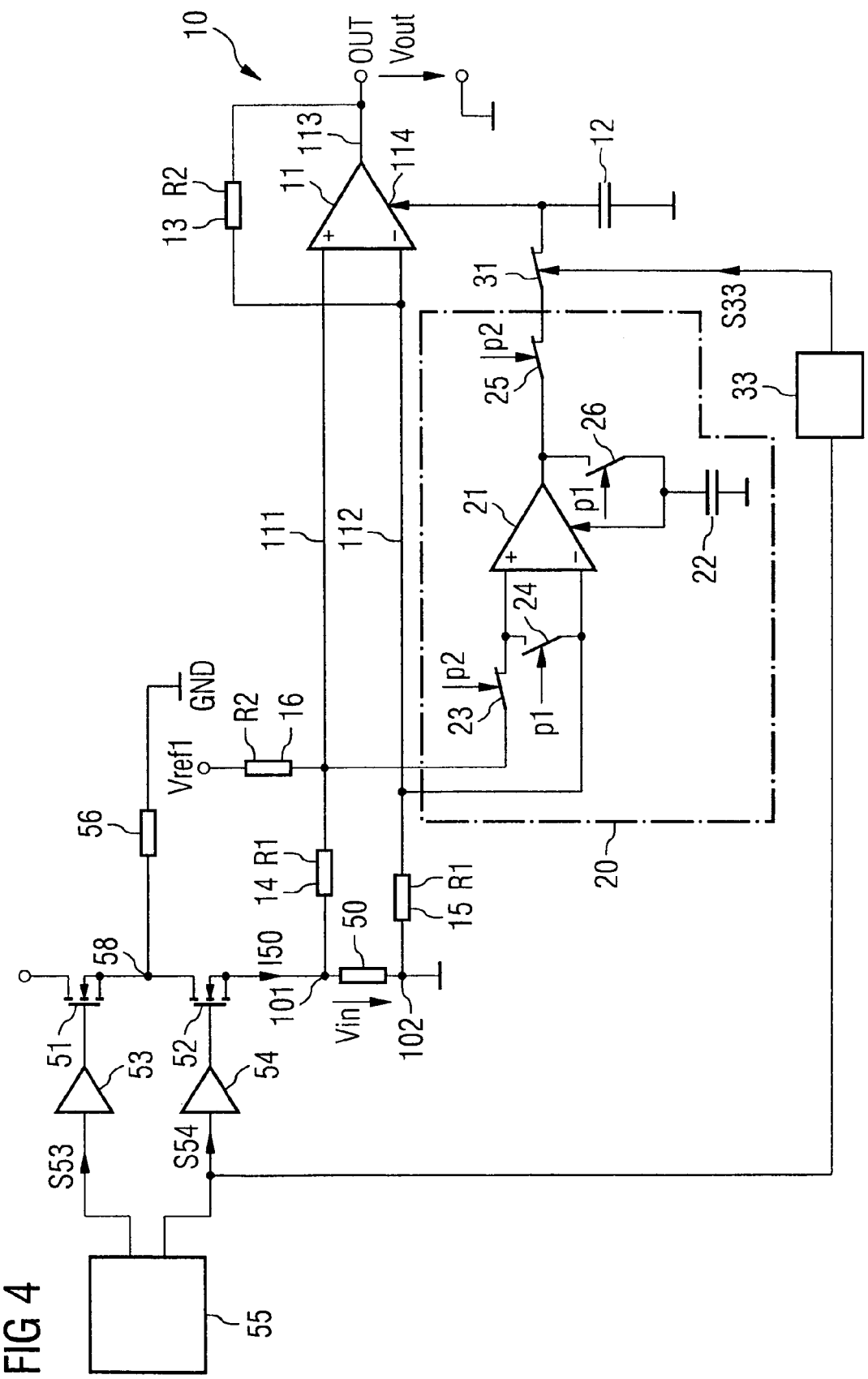
FIG. 4 shows a second exemplary embodiment of a circuit arrangement according to the invention.

FIG. 4 illustrates a use of the circuit arrangement according to at least one embodiment of the invention for determining a load current I50 flowing through a semiconductor switch 52 of a half-bridge circuit. In the example, the half-bridge circuit has two first and second semiconductor switches 51, 52 connected in series between a supply potential Vcc and reference-ground potential GND. In the example, said half-bridge circuit serves for driving a load 56 connected between an output 58 of the half-bridge circuit and reference-ground potential GND. A current measuring resistor 50 is connected in series with the second semiconductor switch 52. Said measuring resistor 50 supplies the input voltage Vin for the amplifier arrangement 10.

The driving of the two semiconductor switches 51, 52 is effected according to control signals S53, S54 provided by a control circuit 55. Driver circuits 53, 54 serve for amplifying said control signals S53, S54 or for converting the levels of said control signals S53, S54 to levels suitable for driving the semiconductor switches 51, 52.

Figure 5:
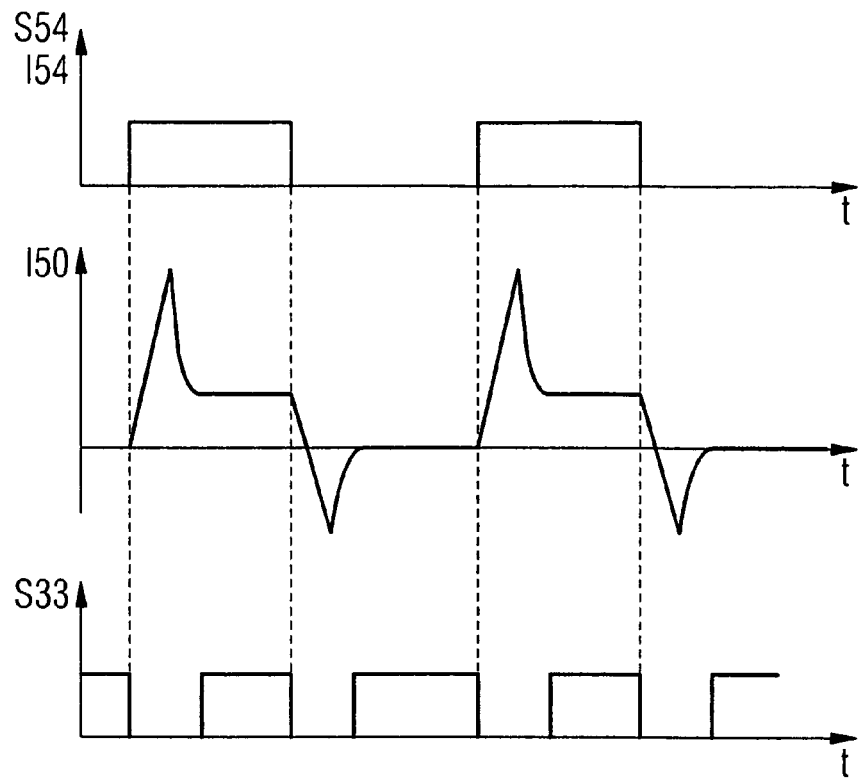
FIG. 5 shows temporal profiles of selected signals occurring in the circuit according to FIG. 4.

FIG. 5 shows, by way of example, the temporal profile of the drive signal S54 of the semiconductor switch 52. In this case, the temporal profile of said control signal S54 corresponds qualitatively to the temporal profile of the current I50 flowing through the second semiconductor switch 52 if the load 56 is an inductive load, such as a motor for example. FIG. 5 additionally shows the temporal profile of the input voltage Vin present across the measuring resistor 50 assuming that the measuring resistor 50 has a parasitic inductance.

In the example, the deactivation circuit 30 has an edge detection circuit 33, to which the control signal S54 according to which the load current I50 is generated is fed. The edge detection circuit 33 is designed to detect rising and falling edges of said control signal S54 and to open the switch 31 after a rising and a falling edge of the control signal S54 in each case for a predetermined time duration, in order thereby to deactivate the compensation arrangement 20. The output signal S33 of said edge detection circuit 33 is likewise illustrated in FIG. 5. In the example, it is assumed that the switch 31 is closed when said output signal S33 has a high level and is open when said output signal S33 has a low level. The time durations for which the output signal S33 of the edge detector 33 in each case assumes a low level after a rising or falling edge of the control signal S54, in order to deactivate the compensation arrangement, may suitably be adapted to the time durations during which the input voltage Vin has voltage spikes on account of the parasitic inductance of the measuring resistor 50, or these time durations are adapted to settling durations of the operational amplifier 11 after a level change of the input signal Vin.

Interference signals may arise during the opening and closing of the switch 31 that deactivates the second compensation arrangement 20, said interference signals being referred to as so-called "switching noise". In order to prevent said switching noise from adversely affecting the generation of the offset compensation signal V12, the operational amplifier 11 may be formed as an operational amplifier with differential offset compensation.

Figure 6:
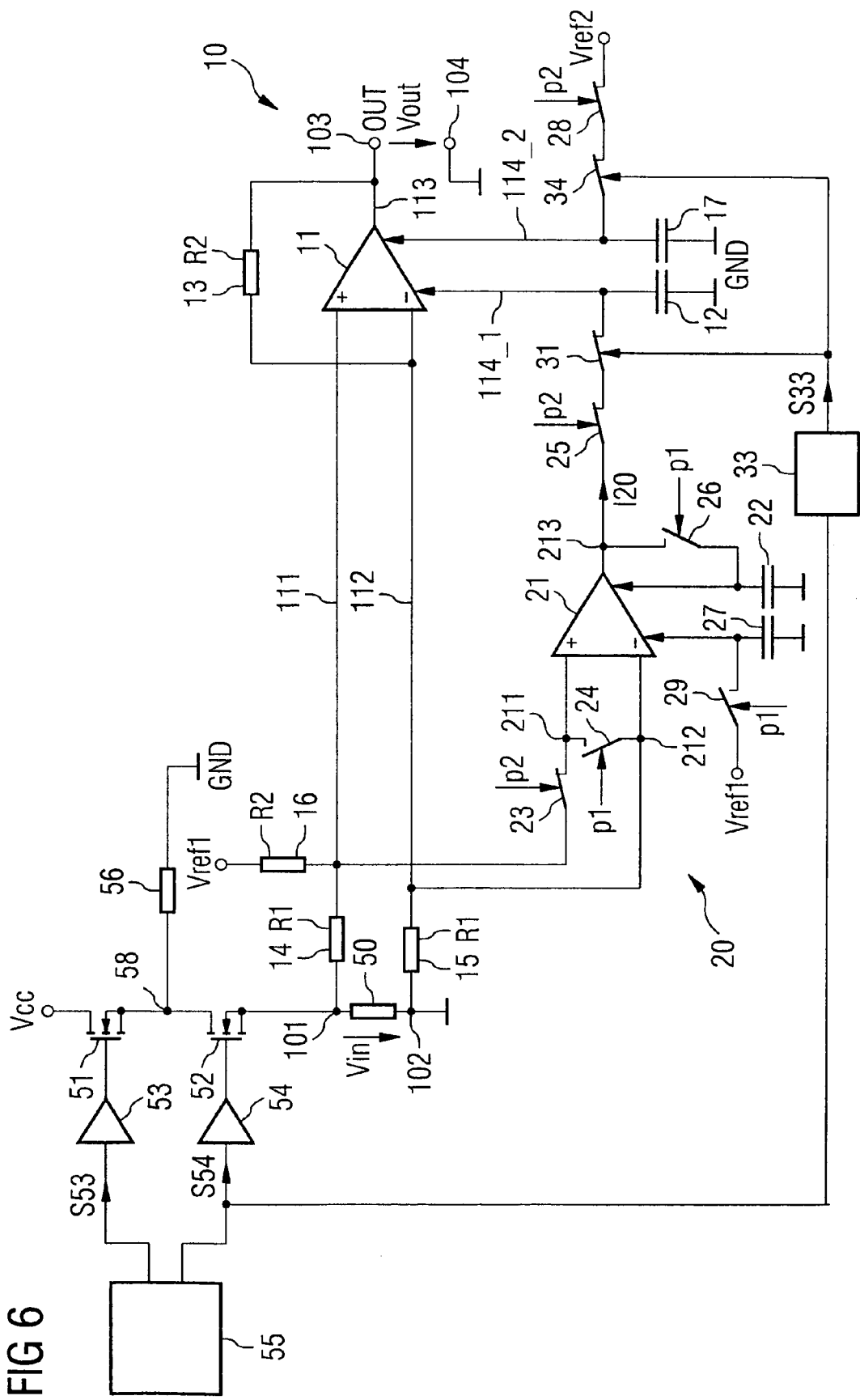
FIG. 6 shows a further exemplary embodiment of a circuit arrangement according to the invention.

FIG. 6 shows a modification of the circuit arrangement illustrated in FIG. 1, in which the operational amplifier 11 is formed as an operational amplifier with differential offset compensation. The operational amplifier 11 has two offset compensation inputs 114_1, 114_2. In this case, the capacitive storage element 12 already explained is connected to the first compensation input 114_1, said storage element being connected to the output of the first compensation arrangement 20. A further capacitive storage element 17 is connected between the second compensation input 114_2 and reference-ground potential GND. Said further capacitive storage element 17 is connected to a terminal for a reference potential Vref2 via a second switch 34 of the deactivation circuit. This further switch 34 is opened and closed jointly with the switch 31 connected between the compensation arrangement 20 and the first capacitive storage element 12.

Figure 7:
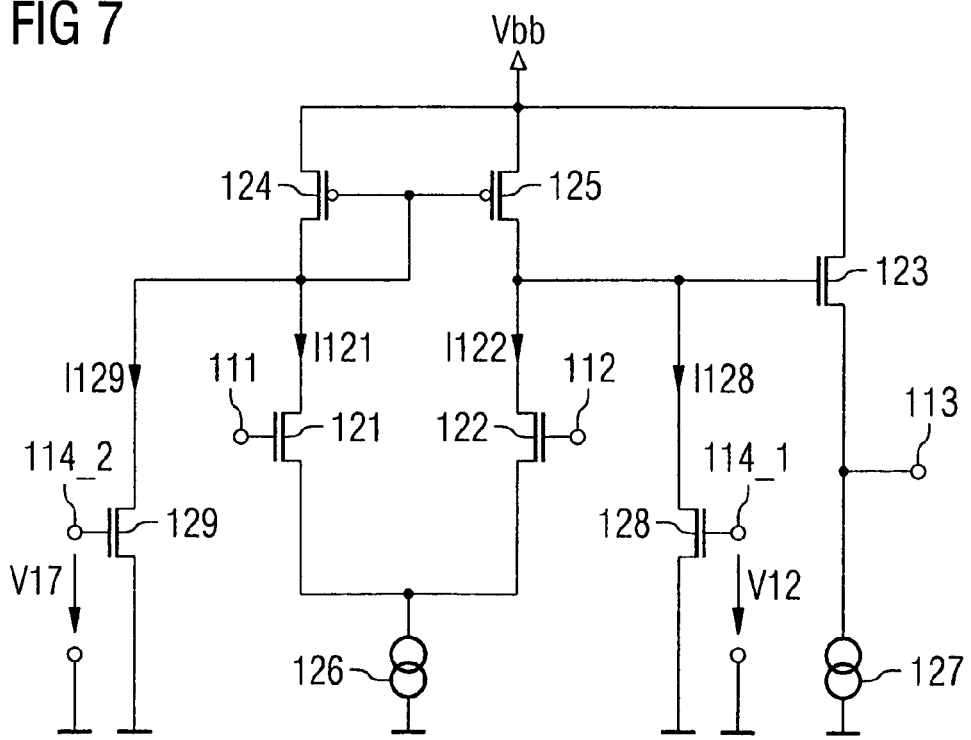
FIG. 7 shows an exemplary circuitry realization of an operational amplifier having two offset compensation inputs.

An exemplary circuitry realization of an operational amplifier with differential offset compensation is illustrated in FIG. 7. The basic construction of this operational amplifier corresponds to the construction of the operational amplifier illustrated in FIG. 3 with the difference that the compensation stage is formed as a differential compensation stage.

In the case of this operational amplifier, the compensation stage comprises a first and second compensation transistor 128, 129. The first compensation transistor 128 is driven by the first compensation signal V12 and its load path is connected between a node common to the current mirror transistor 125 and the second input transistor 122 and reference-ground potential. The second compensation transistor 129 is driven by a compensation signal V17 present across the second capacitive storage element (17 in FIG. 6) and its load path is connected between a node common to the current mirror transistor 125 and the second input transistor 122 and reference-ground potential. The compensation signal which is present at the input of the second compensation transistor 129 and corresponds to the second reference potential with switches 28, 34 closed is referred to below as constant compensation signal.

In the case of the operational amplifier illustrated, a change in the current I122 through the second input transistor 122 with respect to the current through the first input transistor 121 is effected by means of a change in the compensation signal V12 in comparison with the fixed compensation signal V17. Said fixed compensation signal has the effect that part of the current I124 flowing through the current mirror transistor 124 flows away to reference-ground potential via the second compensation transistor 129. If the compensation signal V12 corresponds to the fixed compensation signal V17, then the current I128 flowing through the first compensation transistor 128 corresponds to the current I129 flowing through the second compensation transistor 129. When an offset is not present, the currents I121, I122 through the input transistors are then identical.

The operational amplifier is beset with an offset if the currents I121, I122 through the input transistors 121, 122 are not identical. Depending on the type of offset, compensation of said offset necessitates increasing or reducing the current I121 through the second input transistor 122 in comparison with the current I121 through the first input transistor 121.

In order to increase the current I122 through the second input transistor 122 with respect to the current I121 through the first input transistor 121, the compensation signal V12 is increased in comparison with the fixed compensation signal V17. In this case, the first compensation transistor 128 is regulated down. In order to reduce the current I122 through the second input transistor 122 with respect to the current I121 through the first input transistor 121, the compensation signal V12 is reduced in comparison with the fixed compensation signal V17. In this case, the first compensation transistor 128 is driven up.

Common-mode interference signals which are superposed on the two compensation signals V12, V17 do not affect the offset compensation in the case of this compensation arrangement 128, 129. If an identical interference signal is superposed on the two compensation signals V12, V17, then the two compensation transistors 128, 129 are regulated down or driven up in the same way with the result that the current I122 through the second input transistor 122 does not change in comparison with the current I121 through the first input transistor 121; a difference between these two currents I122 and I121 remains the same and is equal to zero in the case of complete offset compensation. An interference signal which is superposed on the two compensation signals V12, V17 may be for example a switching noise that arises as a result of simultaneous switching of the switches 31, 34.

Referring to FIG. 6, a fifth switch 28 of the compensation arrangement 20 is connected between the further capacitive storage element 117 and the terminal for reference potential Vref2. Said switch 28 is driven by means of the control signal p2 jointly with the fourth switch 25 connected between the output of the transconductance amplifier 21 and the first capacitive storage element 12. In the case where the switches 31, 34 of the deactivation circuit are closed and the compensation arrangement 20 is changed over from the compensation state to the normal state, and vice versa, the fourth switch 25 is opened or closed in the manner explained. In order to prevent switching noise that occurs during the opening and closing of said fourth switch 25 from adversely affecting the offset compensation of the operational amplifier 11, the fifth switch 28 is opened and closed in a manner corresponding to said fourth switch 25.

In accordance with the first operational amplifier 11 of the amplifier arrangement 10, the transconductance amplifier 21 of the compensation arrangement 20 may also be embodied as an operational amplifier with differential offset compensation. In this case, the capacitive storage element 22 that has already been explained previously is connected to a first offset compensation input 214_2 of the transconductance amplifier 21, and a second capacitive storage element 27 is connected to a second offset compensation input 214_2 of said transconductance amplifier 21. The second capacitive storage element 27 is connected to a reference potential Vref1 via a sixth switch 29. Said sixth switch 29 is opened and closed synchronously with the fourth switch 26 by means of the control signal p1. Switching noise that arises as a result of the opening and closing of the fourth switch 26 and could adversely affect the generation of the second compensation signal V22 is compensated for by synchronous opening and closing of the sixth switch 29, which is connected to the second capacitive storage element 27, in such a way that the switching noise does not affect the offset compensation of the transconductance amplifier 21.

The noninverting input of the operational amplifier 11 is connected to a further reference potential Vref1 via a further resistor 16. In the example, said further resistor 16 has the same resistance R2 as the feedback resistor 13 of the operational amplifier 11. The quiescent value output voltage Vout, that is to say the value at which the output voltage Vout is established in the case of an-input voltage Vin=0, is set by way of the ratio of said two resistors 13, 16. Given identical resistors 13, 16, said quiescent value corresponds to the further reference potential. Upon application of an input voltage Vin not equal to zero, the output voltage Vout then changes proceeding from said quiescent value.

The further reference potential Vref2 may correspond to the reference potential Vref1 present for compensation purposes.

In the case of the exemplary embodiments explained above with reference to FIGS. 4 and 6, the compensation arrangement 20 is deactivated depending on a signal S54 which triggers a level change of the input voltage Vin of the amplifier arrangement 10.

Figure 8:
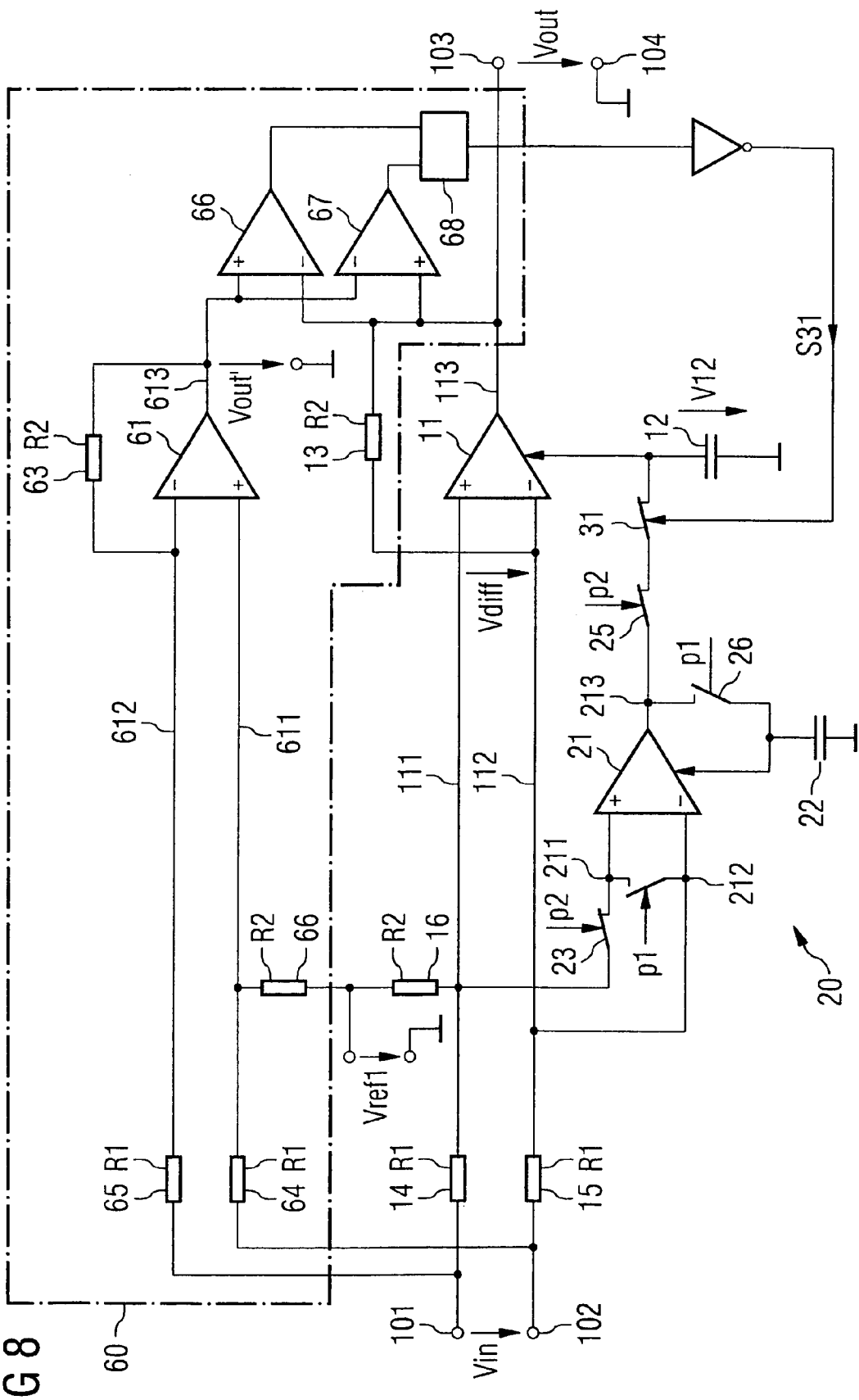
FIG. 8 shows a further exemplary embodiment of the circuit arrangement according to the invention.

FIG. 8 shows an exemplary embodiment of a circuit arrangement according to at least one embodiment of the invention having a deactivation circuit 31, 60, in the case of which no "advance information" about an imminent level change of the input voltage Vin is required for the deactivation of the first compensation arrangement 20. The deactivation circuit has the switch 31 explained previously, said switch being connected between the output 20 of the compensation arrangement and the first capacitive storage element 12. A drive signal S31 is generated by a detector circuit 60, which detects level changes of the input voltage Vin. Said detector circuit 60 has an amplifier arrangement constructed in accordance with the amplifier arrangement 10. This amplifier arrangement of the detector circuit 60 comprises an auxiliary operational amplifier 61 having inputs 611, 612 and an output 613. The inputs 611, 612 of said auxiliary operational amplifier 61 are connected to the inputs 101, 102 of the amplifier arrangement 10 via input resistors 64, 65. The input resistors 64, 65 may suitably be dimensioned in accordance with the input resistors 14, 15 of the amplifier arrangement 10 and have a resistance R1. The auxiliary operational amplifier 61 is connected up in accordance with the operational amplifier 11 of the amplifier arrangement. For this purpose, the output 613 of said auxiliary operational amplifier is feedback-connected to the inverting input 612 of the auxiliary operational amplifier 61 via a feedback resistor 63, which is dimensioned in accordance with the feedback resistor 13 of the operational amplifier 11.

The first operational amplifier 11 and the auxiliary operational amplifier 61 are dimensioned such that they have different time constants, and that is to say that they react at different speeds to changes in the input voltage Vin. This is explained on the basis of temporal profiles of the output voltages Vout of the operational amplifier 11 and Vout' of the auxiliary operational amplifier 61 with reference to FIG. 9.

Figure 9:
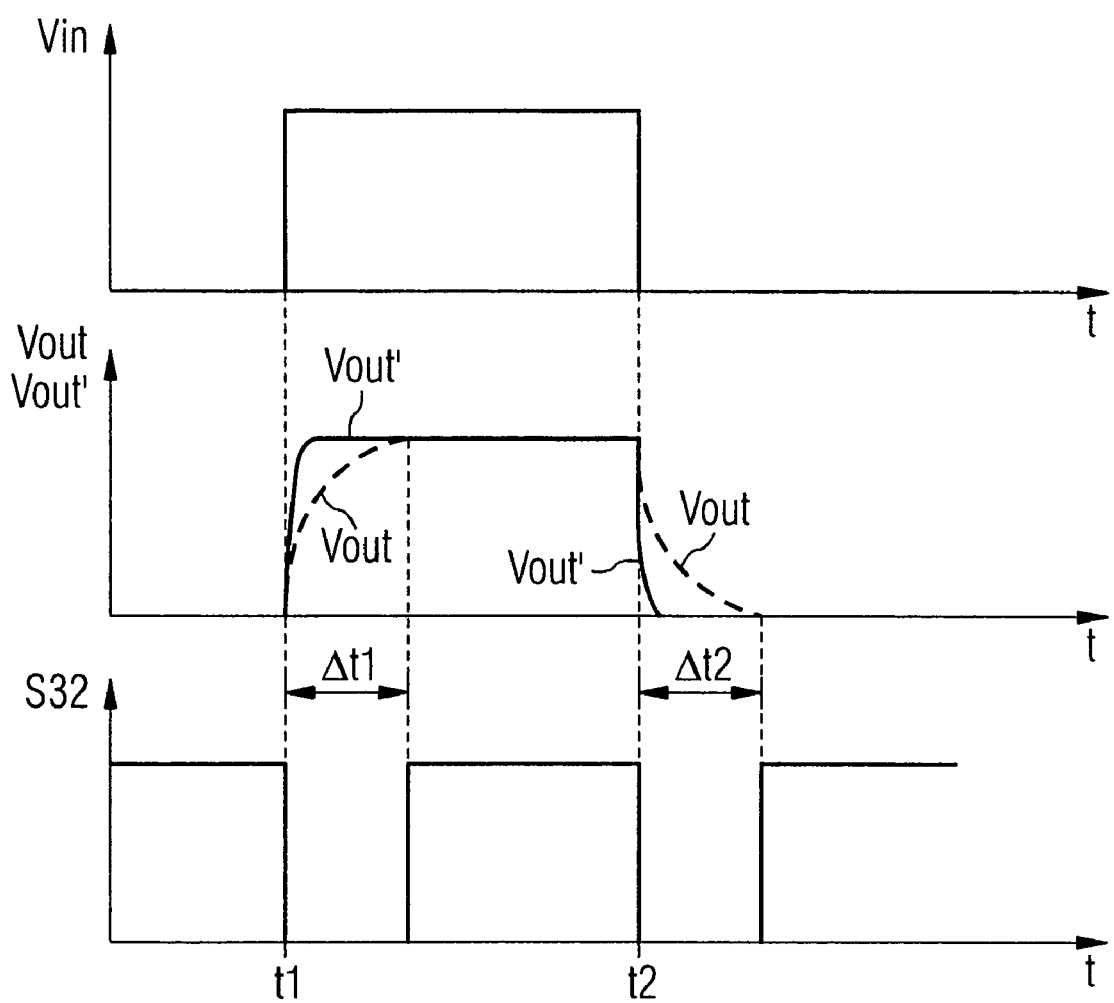
FIG. 9 shows, by way of example, temporal profiles of selected signals occurring in the circuit arrangement according to FIG. 8.

FIG. 9 shows, by way of example, a temporal profile of the input voltage Vin, which has a rising edge at an instant t1 and a falling edge at an instant t2 and which has a constant signal level between these two instants t1, t2. With the rising edge of the input signal Vin, the output voltages Vout, Vout' of the two amplifiers 11, 61 start to rise, but at different rates on account of the different time constants. In the example, the time constant of the auxiliary operational amplifier 61 is shorter than the time constant of the first operational amplifier 11, so that the output voltage Vout' of the auxiliary operational amplifier 61 rises more rapidly than the output voltage Vout of the operational amplifier 11 after a rising edge of the input voltage Vin and falls more rapidly than the output voltage Vout of the operational amplifier 11 after a falling edge of the input voltage Vin. The operational amplifiers 11, 61 are dimensioned and connected up in such a way that the output voltage Vout of the operational amplifier 11 corresponds to the output voltage Vout' of the auxiliary operational amplifier 61 in the settled state. After a rising edge of the input voltage Vin and after a falling edge of the input voltage Vin, the output voltages Vout, Vout' differ on account of the different time constants in each case for time durations $\Delta t1$, $\Delta t2$.

An evaluation circuit having two comparators 66, 67 and a logic gate 68 evaluates the output voltages Vout, Vout' of the two amplifiers 11, 61 in order to generate the drive signal S31 of the switch 31 therefrom. This evaluation circuit 66, 67, 68 has the task of opening the switch 31 during the time durations $\Delta t1$, $\Delta t2$ after rising and falling edges of the input voltage Vin. For this purpose, the output voltage Vout of the operational amplifier 11 and the output voltage Vout' of the auxiliary operational amplifier 61 are in each case fed to the comparators 66, 67. During the time durations $\Delta t1$, $\Delta t2$ during which these two voltages Vout, Vout' deviate from one another, the output signal of a respective one of these two comparators 66, 67 has a high level. In this example, the logic gate 68 is formed as an XOR gate, which supplies a high level at its output in each case when the two comparator output signals deviate from one another. This output signal of the XOR gate is inverted by means of an inverter 69. The control signal S31 for the switch 31 is present at the output of said inverter 69. Said control signal S31 assumes a low level in each case during the time durations $\Delta t1$, $\Delta t2$ in order to open the switch 31 and thereby to deactivate the compensation arrangement 20.

The deactivation circuit 60, 31 explained ensures that the compensation arrangement 20 is deactivated in each case after rising and falling edges of the input voltage Vin, as a result of which settling operations of the operational amplifier 11 that follow such a level change of the input voltage Vin, by means of the compensation arrangement 20, do not affect the generation of the offset compensation signal V21.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A circuit arrangement comprising:
a first amplifier circuit including signal inputs configured to receive an input signal, a signal output configured to provide an output signal, and a first operational amplifier, wherein the first operational amplifier includes first operational amplifier inputs connected to the signal inputs, a first operational amplifier output coupled to the signal output, and a first compensation input configured to receive an offset compensation signal;
a first compensation circuit connected to the first operational amplifier inputs, wherein the first compensation circuit is configured to provide the offset compensation signal; and
a deactivation circuit configured to deactivate the first compensation circuit depending on the input signal and for a time duration after a level change of the input signal.

2. The circuit arrangement of claim 1 wherein the deactivation circuit comprises
an auxiliary amplifier circuit including auxiliary amplifier inputs connected to the signal inputs of the first amplifier circuit, an auxiliary amplifier output configured to provide an auxiliary output signal, and an auxiliary operational amplifier, wherein the auxiliary operational amplifier includes auxiliary operational amplifier inputs connected to the auxiliary amplifier inputs, and an auxiliary operational amplifier output coupled to the auxiliary amplifier output, and
a combination circuit, wherein the combination circuit is configured to receive the output signal and the auxiliary output signal, and wherein the combination circuit is configured to generate a deactivation signal depending on a comparison of the output signal and the auxiliary output signal.

3. The circuit arrangement of claim 2 wherein the auxiliary operational amplifier and the operational amplifier have different time constants.

4. The circuit arrangement of claim 2 wherein the combination circuit comprises an XOR gate.

5. The circuit arrangement of claim 1 wherein the first compensation circuit comprises a second operational amplifier including second operational amplifier inputs connected to the first operational amplifier inputs, a second operational amplifier output, and a second compensation input.

6. The circuit arrangement of claim 5 further comprising a second compensation circuit connected to the second compensation input, wherein the second compensation circuit is configured to generate a second compensation signal for the second operational amplifier.

7. The circuit arrangement of claim 5 wherein the second operational amplifier is a transconductance amplifier, and wherein the first compensation circuit includes a capacitive storage element connected to the second operational amplifier output and to the first compensation input of the first operational amplifier, and wherein the offset compensation signal is present across the capacitive storage element.

8. The circuit arrangement of claim 7 wherein the deactivation circuit comprises a switch connected between the second operational amplifier and the capacitive storage element.

9. The circuit arrangement of claim 1 wherein the output of the first operational amplifier is feedback-connected to one of the first operational amplifier inputs.

10. The circuit arrangement of claim 1 further comprising a measuring resistor connected between the signal inputs of the first amplifier circuit.

11. The circuit arrangement of claim 10 wherein the circuit arrangement is configured to provide a control signal, wherein a measurement current flows through the measuring resistor according to the control signal, and wherein the deactivation circuit is designed to deactivate the first compensation circuit according to the control signal.

12. A circuit arrangement comprising:
 a first amplifier circuit, the first amplifier circuit including first amplifier inputs configured to receive an input signal, a first amplifier output configured to provide an output signal, and a first compensation input configured to receive an offset compensation signal;
 a first compensation circuit connected to the first amplifier inputs, the first compensation circuit configured to receive the input signal and provide the offset compensation signal; and
 a deactivation circuit configured to deactivate the first compensation circuit depending on the input signal and for a time duration after a level change of the input signal received by the first compensation circuit.

13. The circuit arrangement of claim 12 wherein the deactivation circuit is configured to deactivate the first compensation circuit for a predetermined time duration after a level change of the input signal.

14. The circuit arrangement of claim 12 wherein the deactivation circuit comprises an auxiliary amplifier circuit including auxiliary amplifier inputs configured to receive the input signal and an auxiliary amplifier output configured to provide an auxiliary output signal.

15. The circuit arrangement of claim 14 wherein the deactivation circuit further comprises a combination circuit, wherein the combination circuit is configured to receive the output signal and the auxiliary output signal and generate a deactivation signal depending on a comparison of the output signal and the auxiliary output signal.

16. The circuit arrangement of claim 14 wherein the first amplifier circuit comprises a first operational amplifier and wherein the auxiliary amplifier circuit comprises an auxiliary operational amplifier.

17. A circuit arrangement comprising:
 a first amplifier circuit, the first amplifier circuit including means for receiving an input signal, means for providing an output signal, and means for receiving an offset compensation signal;
 a first compensation circuit connected to the first amplifier circuit, the first compensation circuit comprising means for receiving the input signal and means for providing the offset compensation signal to the first amplifier circuit; and
 means for deactivating the first compensation circuit depending on the input signal and for a determined time duration after a level change of the input signal.

* * * * *